(12) United States Patent
Yoshida et al.

(10) Patent No.: US 9,279,194 B2
(45) Date of Patent: Mar. 8, 2016

(54) METHOD OF GROWING III-NITRIDE CRYSTAL

(75) Inventors: Hiroaki Yoshida, Itami (JP); Shinsuke Fujiwara, Itami (JP); Koji Uematsu, Itami (JP); Masanori Morishita, Itami (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 1223 days.

(21) Appl. No.: 12/630,836

(22) Filed: Dec. 3, 2009

(65) Prior Publication Data

US 2010/0139553 A1   Jun. 10, 2010

(30) Foreign Application Priority Data

Dec. 4, 2008 (JP) ................. 2008-309737

(51) Int. Cl.
*C30B 25/20* (2006.01)
*C30B 29/40* (2006.01)

(52) U.S. Cl.
CPC ............... *C30B 25/20* (2013.01); *C30B 29/406* (2013.01)

(58) Field of Classification Search
USPC ................ 117/81, 82, 83, 90, 104, 109
See application file for complete search history.

(56) References Cited

U.S. PATENT DOCUMENTS

| 2004/0003495 | A1* | 1/2004 | Xu ..................................... 29/832 |
| 2007/0003467 | A1* | 1/2007 | Sunkara et al. ............... 423/348 |
| 2008/0081015 | A1* | 4/2008 | Sarayama et al. ............ 423/409 |
| 2008/0311393 | A1* | 12/2008 | Dwilinski et al. ............ 428/337 |

FOREIGN PATENT DOCUMENTS

| JP | 2004-224600 A | 8/2004 |
| JP | 2007-126320 A | 5/2007 |
| JP | 2008-133151 A | 6/2008 |
| WO | WO-2007-023722 A1 | 3/2007 |

OTHER PUBLICATIONS

B. Lucznik et al., "Deposition of Thick GaN Layers by HVPE on the Pressure Grown GaN Substrates," Jul. 2005, pp. 38-46, vol. 281, Elsevier, NY.

* cited by examiner

*Primary Examiner* — Robert M Kunemund
(74) *Attorney, Agent, or Firm* — James W. Judge

(57) ABSTRACT

Affords a method of growing, across the entirety of a major surface of a first III-nitride crystal, a second III-nitride crystal by HVPE, in an ambient temperature higher than 1100° C. The present III-nitride crystal growth method comprises: a step of preparing a first III-nitride crystal (10) having an alkali-metal atom concentration of less than $1.0 \times 10^{18}$ cm$^{-3}$; and a step of growing a second III-nitride crystal (20) onto a major surface (10*m*) of the first III-nitride crystal (10) by HVPE, in an ambient temperature higher than 1100° C.

5 Claims, 1 Drawing Sheet

METHOD OF GROWING III-NITRIDE CRYSTAL

BACKGROUND OF THE INVENTION

1. Technical Field

The present invention relates to III-nitride crystal growth methods in which, onto a major surface of a first III-nitride crystal, a second III-nitride crystal is grown by hydride vapor-phase epitaxy (HVPE), under a high-temperature ambient exceeding 1100° C.

2. Description of the Related Art

III-nitride crystals such as GaN crystal are ideally suited to semiconductor-device applications including light-emitting devices and electronic devices. Large-scale III-nitride crystal is consequently in demand. Therein, vapor-phase growth—HVPE in particular—is a technique suited to growing large-scale III-nitride crystal efficiently, since the crystal-growth speeds are high.

Meanwhile, liquid-phase growth—in particular, solution methods in which a source-material melt is employed—is a technique suited to growing low-dislocation density, highly crystalline III-nitride crystal.

In this respect, in order to efficiently grow low-dislocation density, highly crystalline III-nitride crystal that is large-scale, B. Lucznik et al., "Deposition of Thick GaN Layers by HVPE on the [sic] Pressure Grown GaN Substrates," *Journal of Crystal Growth*, Vol. 281, 2005, pp. 38-46, (Non-Patent Document 1), propose a method of growing GaN crystal by HVPE into a GaN crystal substrate obtained by a solution-growth technique. Non-Patent Document 1: "Deposition of Thick GaN Layers by HVPE on the [sic] Pressure Grown GaN Substrates," *Journal of Crystal Growth*, Vol. 281, 2005, pp. 38-46.

Nevertheless, large-scale crystal is not obtainable with the method in foregoing Non-Patent Document 1. To be specific, the problem is that if GaN crystal is grown following the growth method in foregoing Non-Patent Document 1 at temperatures higher than 1100° C. onto a GaN crystal substrate obtained by solution growth, numerous regions where GaN crystal does not grow onto the major surface of the GaN crystal substrate (crystal non-growth regions) appear.

Therein, in order to investigate the cause of this sort of problem, the present inventors conducted several different analyses, utilizing a variety of methods, of the surface layers in the just-noted regions. As a result, the present inventors came to complete the present invention by discovering that under secondary ion mass spectrometry (SIMS) the concentration of alkali metal atoms in the regions is $1.0\times10^{18}$ cm$^{-3}$, and further by discovering that GaN crystal will grow onto a GaN crystal substrate in which the concentration of alkali metal atoms is less than $1.0\times10^{18}$ cm$^{-3}$.

Thus an object of the present invention, in order to resolve the problem discussed above, is to make available a method of growing, across the entirety of a major surface of a first III-nitride crystal (e.g., a GaN crystal substrate), a second III-nitride crystal (e.g., GaN crystal) by HVPE, in an ambient temperature higher than 1100° C.

BRIEF SUMMARY OF THE INVENTION

The present invention is a III-nitride crystal growth method comprising: a step of preparing a first III-nitride crystal having an alkali-metal atom concentration of less than $1.0\times10^{18}$ cm$^{-3}$; and a step of growing a second III-nitride crystal onto a major surface of the first III-nitride crystal by HVPE, in an ambient temperature higher than 1100° C.

In a III-nitride crystal growth method involving the present invention it is possible to have the alkali-metal atom concentration in the first III-nitride crystal be less than $1.0\times10^{16}$ cm$^{-3}$. It is also possible to have the first III-nitride crystal be a crystal obtained by solution growth utilizing a solution in which nitrogen has been dissolved in a melt of a Group-III metallic element.

The present invention enables the provision of a method of growing across the entirety of a major surface of a first III-nitride crystal, a second III-nitride crystal by HVPE, in an ambient temperature higher than 1100° C.

Legend

1: starting substrate; 1*m*, 10*m*: major surface; 1*a*: III-nitride seed crystal; 1*b*: base substrate; 10: first III-nitride crystal; 13: melt; 13*m*: surface; 15: dissolution of nitrogen into melt; 17: solution; 20: second III-nitride crystal; 21: HCl gas; 22: Group-III metal atoms; 23: Group-III metallic element source gas; 25: nitrogen source gas; 29: exhaust gas; 100: HVPE apparatus; 110: reaction chamber; 113: source-gas introduction line; 115: gas evacuation line; 119: crystal holder; 120: Group-III metallic element source-gas preparation chamber; 121: Group-III metallic element boat; 122: HCl gas introduction line; 123: Group-III metallic element source-gas introduction line; 131, 132, 133, 230: heaters; 200: solution-growth deposition apparatus; 210: growth vessel; 220: growth chamber; 220*e*: gas supply port

DETAILED DESCRIPTION OF THE INVENTION

Figure 1:
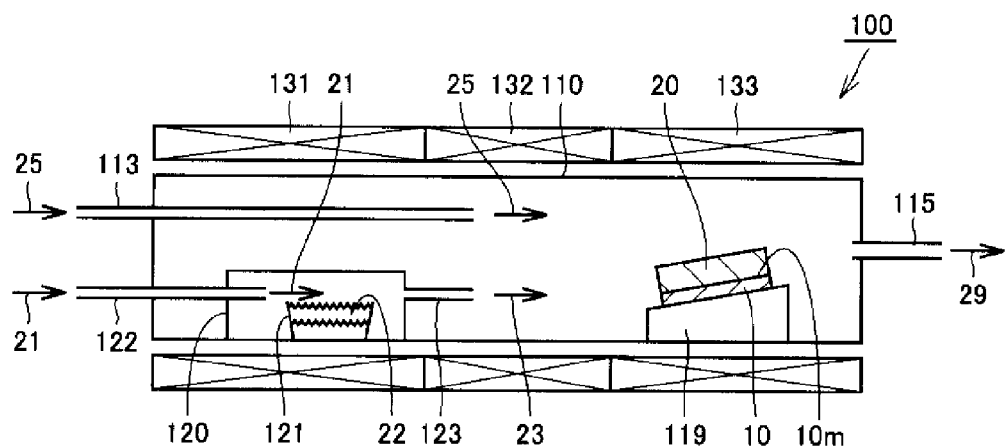
FIG. 1 is a simplified sectional diagram for illustrating one mode of embodying a III-nitride crystal growth method involving the present invention.

Referring to FIG. 1, an explanation of one mode of embodying a III-nitride crystal growth method involving the present invention will specifically be made. In this embodying mode, a step of preparing a first III-nitride crystal 10 having an alkali-metal atom concentration of less than $1.0\times10^{18}$ cm$^{-3}$, and a step of growing a second III-nitride crystal 20 onto a major surface 10*m* of the first III-nitride crystal 10 by HVPE, in an ambient temperature higher than 1100° C. are provided. Even with the ambient temperature in the HVPE growth being a temperature higher than 1100° C., onto first III-nitride crystal 10 having an alkali-metal atom concentration of less than $1.0\times10^{18}$ cm$^{-3}$, it is possible to grow second III-nitride crystal across the entirety of the major surface 10*m*. Herein, "III-nitride crystal" means crystal that contains as the main elemental constituents a Group-III metallic element(s) such as Ga, Na or In, and nitrogen. Examples that may be cited include $Al_xGa_yIn_{1-x-y}N$ ($0 \le x$, $0 \le y$, $x+y \le 1$) crystal.

Step of Preparing First III-Nitride Crystal

Reference is made to FIG. 1: A first III-nitride crystal 10 prepared in the present embodying mode has an alkali-metal atom concentration of less than $1.0\times10^{18}$ cm$^{-3}$. Across the entirety of the major surface 10*m* of such first III-nitride crystal 10, a second III-nitride crystal 20 is grown, in an ambient temperature higher than 1100° C.

Herein, if the alkali-metal atom concentration in the first III-nitride crystal 10 is $1.0\times10^{16}$ cm$^{-3}$ or more but less than $1.0\times10^{18}$ cm$^{-3}$, second III-nitride crystal 20 grows across the entirety of the major surface 10*m* of the first III-nitride crystal 10, but rough areas appear in the crystal-growth face of the second III-nitride crystal, giving rise to abnormal crystal-growth regions. The "abnormal crystal-growth regions" are crystal regions, spanning some 100 μm to 1 mm on average, that have grown non-epitaxially with respect to the first III-nitride crystal, with the crystallographic orientation differing vastly from that of the regions where the crystal has grown epitaxially. Consequently, the abnormal crystal-growth regions may be readily observed under an optical microscope at a low magnification of from 5× to 50× or so.

And if the alkali-metal atom concentration in the first III-nitride crystal 10 is less than $1.0\times10^{16}$ cm$^{-3}$, second III-nitride crystal 20 grows stably across the entirety of the major surface 10$m$ of the first III-nitride crystal 10, with its crystal-growth face turning out as a flat surface free of rough areas, without abnormal crystal-growth regions arising. Thus, from the perspective of growing second III-nitride crystal 20 stably, it is preferable that the alkali-metal atom concentration in the first III-nitride crystal 10 be less than $1.0\times10^{16}$ cm$^{-3}$.

Figure 2:
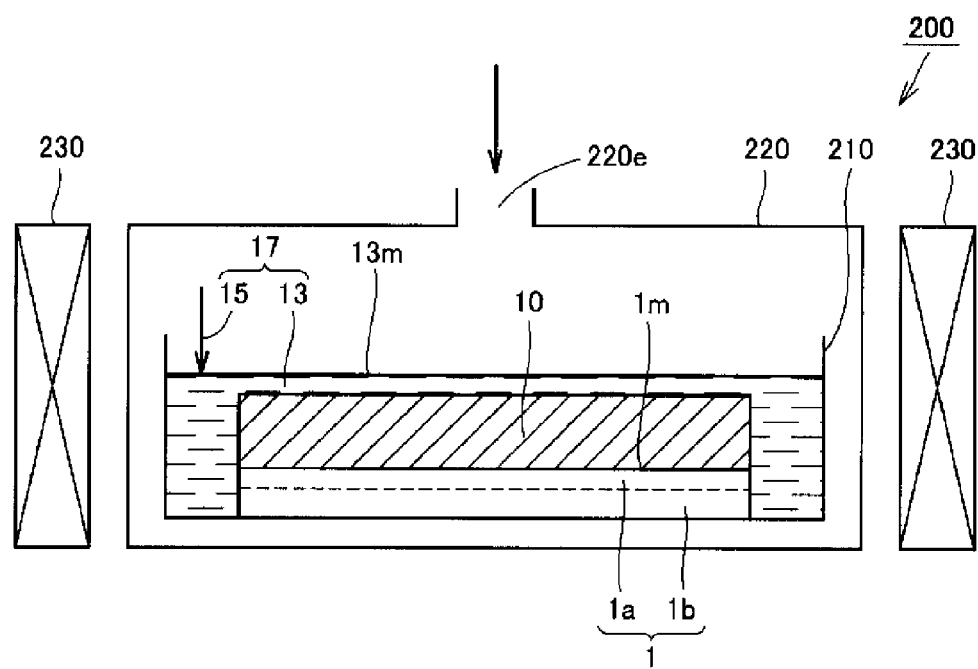
FIG. 2 is a simplified sectional diagram for illustrating a method of growing first III-nitride crystal prepared in a III-nitride crystal growth method involving the present invention.

Further, explaining with reference to FIG. 2, it is preferable that the first III-nitride crystal 10 be a crystal obtained by solution growth utilizing a solution 17 in which into a melt 13 of a Group-III metallic element, nitrogen has been dissolved (a dissolution 15 of nitrogen into a Group-III metallic element melt). This is because III-nitride crystal obtained by solution growth has a low dislocation density and a high degree of crystallinity. From the perspective of growing large-scale first III-nitride crystal, furthermore, in the solution growth it is preferable to employ a starting substrate 1. Herein, it is sufficient that the starting substrate 1 contain a III-nitride seed crystal 1$a$ having a major surface 1$m$, and it may be a template substrate in which the III-nitride seed crystal 1$a$ is formed onto a base substrate 1$b$, or it may be a freestanding substrate in which the entire starting substrate is formed by the III-nitride seed crystal 1$a$. If the starting substrate 1 is a template substrate, then preferably a sapphire substrate, SiC substrate, GaAs substrate, or other substrate whose lattice mismatch with the III-nitride seed crystal 1$a$ is small is utilized as the base substrate 1$b$. With the starting substrate 1, the method of forming the III-nitride seed crystal 1$a$ is not particularly limited; methods that may be cited include vapor-phase techniques such as hydride vapor-phase epitaxy (HVPE) or metalorganic chemical vapor-phase deposition (MOCVD), and liquid-phase techniques such as solution growth.

In solution growth of the present embodying mode, a solution-growth deposition apparatus 200 as represented in FIG. 2 is utilized, and the solution 17 in which into a melt 13 of a Group-III metallic element, nitrogen has been dissolved (a dissolution 15 of nitrogen into a Group-III metallic element melt) is contacted onto a major surface 1$m$ of the aforedescribed starting substrate 1, to grow first III-nitride crystal 10 onto the major surface 1$m$ of the starting substrate 1. Herein, from the perspective of growing first III-nitride crystal whose concentration of alkali-metal atoms and other impurities is low, the purity of the Group-III metallic element melt 13 preferably is 99 mass % or greater, more preferably 99.9 mass % or greater. Also, it is preferable that the nitrogen purity of the nitrogen source gas be 99 mass % or greater, more preferably 99.9 mass % or greater.

The ambient temperature during the crystal growth preferably is, from the perspective of efficiently growing highly crystalline first III-nitride crystal 10, between 1000° C. and 1300° C. Further, for the dissolution 15 of nitrogen into the Group-III metallic element melt 13, the pressure of the nitrogen source gas supplied to a growth vessel 210 within the growth chamber 220 preferably is, from the perspective of efficiently growing highly crystalline first III-nitride crystal 10, between 100 MPa and 300 MPa.

It is also preferable that the first III-nitride crystal 10 be of the same chemical composition as the second III-nitride crystal grown onto the major surface 10$m$ of the first III-nitride crystal. This is because epitaxially growing, onto the major surface of first III-nitride crystal 10 (first $Al_xGa_yIn_{1-x-y}N$ (0≤x, 0≤y, x+y≤1) crystal), second III-nitride crystal 20 (second $Al_xGa_yIn_{1-x-y}N$ (0≤x, 0≤y, x+y≤1) crystal) yields low dislocation density, highly crystalline second III-nitride crystal 20.

Step of Growing Second III-Nitride Crystal

Reference is made to FIG. 1: A III-nitride crystal growth method in the present embodying mode comprises a step of growing second III-nitride crystal 20 onto a major surface 10$m$ of the first III-nitride crystal 10 by HVPE, in an ambient temperature higher than 1100° C.

Herein, "HVPE" is one type of vapor-phase deposition process, and one technique for the Group-III metallic element source material is to employ a gaseous halide of a Group-III metallic element. Among vapor-phase deposition processes, HVPE makes it possible to grow the second III-nitride crystal efficiently and at high crystal-growth rates.

With reference again to FIG. 1, provided in an HVPE apparatus 100 for growing, by HVPE, second III-nitride crystal 20 onto the major surface 10$m$ of the foregoing first III-nitride crystal 10 are: a reaction chamber 110, a chamber 120 for preparing Group-III metallic element source gas, and heaters 131, 132, and 133 for heating the reaction chamber 110 and the Group-III metallic element source-gas preparation chamber 120. An HCl gas introduction line 122 for introducing HCl gas 21 into the interior of the Group-III metallic element source-gas preparation chamber 120 is arranged in the reaction chamber 110 and the Group-III metallic element source-gas preparation chamber 120. In the Group-III metallic element source-gas preparation chamber 120, for filling the interior thereof with Group-III metal atoms 22, a Group-III metallic element boat 121 is disposed, and a Group-III metallic element source-gas introduction line 123 is arranged, in order to introduce prepared Group-III metallic element source gas 23 into the interior of the reaction chamber 110. In the reaction chamber 110, a nitrogen source-gas introduction line 113 for introducing nitrogen source gas 25 into the interior of the reaction chamber 110, and a gas evacuation line 115 for evacuating exhaust gas 29 from the reaction chamber 110 are arranged. Further, a crystal holder 119, for positioning the first III-nitride crystal 10 in order to grow the second III-nitride crystal, is disposed inside the reaction chamber 110. The reaction tube that forms the reaction chamber 110 is not particularly limited, but from the perspective that larger reaction tubes are easier to fabricate, a quartz reaction tube preferably is utilized.

Second III-nitride crystal 20 is grown onto the major surface 10$m$ of the foregoing first III-nitride crystal 10 by HVPE in the following way, referring still again to FIG. 1.

HCL gas 21 is introduced into the Group-III metallic element source-gas preparation chamber 120 via the HCl gas introduction line 122. The Group-III metallic element boat 121, which is filled with Group-III metal atoms 22, is disposed in the interior of the Group-III metallic element source-gas preparation chamber 120. Group-III metallic element chloride gas, as the Group-III metallic element source gas 23, is generated by the reaction of the Group-III metal atoms 22 with the HCl gas 21.

The Group-III metallic element source gas 23 is introduced into the reaction chamber 110 interior from the Group-III metallic element source-gas preparation chamber 120 via the Group-III metallic element source-gas introduction line 123. Meanwhile, NH$_3$ gas, as the nitrogen source gas 25, is introduced into the reaction chamber 110 interior via the nitrogen source-gas introduction line 113. In the reaction chamber 110 interior, second III-nitride crystal 20 grows onto the major surface 10$m$ of the first III-nitride crystal 10, emplaced on the crystal holder 119 in the crystal-growth section, by the reaction of the Group-III metallic element source gas 23 with the nitrogen source gas 25. Excess gas is evacuated as exhaust gas 29 from the reaction chamber 110 interior via the gas evacuation line 115. During these processes, in order to transport the Group-III metallic element source gas and nitrogen source gas efficiently, as well as to adjust the partial pressure of each source gas, a carrier gas is employed at the same time. Gaseous hydrogen (H$_2$ gas), gaseous nitrogen (N$_2$ gas), etc. may be employed as the carrier gas.

In an ordinary HVPE process, from the perspective of efficiently growing second III-nitride crystal 20 onto the major surface 10$m$ of the first III-nitride crystal 10, the ambient temperature in the source-gas introduction section is adjusted to some 800° C. to 900° C., while the ambient temperature in the crystal-growth section is adjusted to some 1000° C. to 1100° C. Herein, the "source-gas introduction section" is the area in the reaction chamber 110 where the HCl gas introduction line 122, the Group-III metallic element source-gas preparation chamber 120, the Group-III metallic element source-gas introduction line 123, and the nitrogen source-gas introduction line 113 are disposed and the area in the vicinity thereof, and means chiefly the area heated by the heaters 131 and 132. Likewise, the "crystal-growth section" is the area in the reaction chamber 110 where the crystal holder 119 is disposed and the area in the vicinity thereof, and means chiefly the area heated by the heater 133.

In the HVPE process of the present embodying mode, the ambient temperature in the crystal-growth section is adjusted to a temperature higher than 1100° C. Because a first III-nitride crystal having an alkali-metal atom concentration of less than $1.0 \times 10^{18}$ cm$^{-3}$ is utilized in the HVPE process of the present embodying mode, second III-nitride crystal grows across the entirety of the major surface 10$m$ of the first III-nitride crystal 10. It should be noted herein that from the perspective of preventing deterioration of the reaction chamber, it is preferable that the ambient temperature in the crystal-growth section be not greater than 1200° C.

EMBODIMENTS

Embodiment 1

1. Preparation of First III-Nitride Crystal

Referring to FIG. 2, an explanation will be made.

To begin with, a 2-inch (5.08-cm) diameter GaN template substrate (starting substrate 1) was placed inside a crucible (growth vessel 210) in such a way that its major surface 1$m$ was exposed. This starting substrate 1 was one in which GaN seed crystal (III-nitride seed crystal 1$a$) of 2000 nm thickness was formed by MOCVD onto a (0001) sapphire substrate (base substrate 1$b$).

Following that, metallic Ga (Group-III metallic element) of 99.9 mass % purity was placed inside the crucible (growth vessel 210). Herein, with the metallic Ga having liquefied into a melt 13, the mass when the depth from the surface 13$m$ of the melt 13 down to the major surface 1$m$ of the GaN template substrate (starting substrate 1) had reached 5 mm was taken as the mass of the metallic Ga.

The foregoing crucible (growth vessel 210) into which the GaN template substrate (starting substrate 1) and the metallic Ga (Group-III metallic element) had been placed was set inside the growth chamber 220. Nitrogen gas (nitrogen source gas) of 99.99 mass % purity was supplied into the growth chamber 220 through a gas supply port 220$e$, and the ambient pressure inside the growth chamber 220 was brought to 1 MPa. Subsequently, the heater 230 was employed to ramp the ambient temperature inside the growth chamber 220 up to 1100° C. to liquefy the metallic Ga and yield a Ga melt (melt 13 of a Group-III metallic element). Following that, further nitrogen gas (nitrogen source gas) of 99.99 mass % purity was supplied into the growth chamber 220, and by bringing the ambient pressure inside the growth chamber 220 to 150 MPa, a solution 17 in which into the Ga melt (melt 13 of a Group-III metallic element), a dissolution 15 of nitrogen had been made was obtained. First GaN crystal (first III-nitride crystal 10) of 1 mm thickness was grown onto the major surface 1$m$ by the contacting of this solution 17 on the major surface 1$m$ of the GaN template substrate (starting substrate 1). Subsequently, platelike freestanding GaN crystal A (first III-nitride crystal 10) of 600 μm thickness was obtained from the first GaN crystal. The concentration of alkali metal atoms in the obtained freestanding GaN crystal A (first III-nitride crystal 10) was, upon analyzing the crystal edges by SIMS, $8.0 \times 10^{15}$ cm$^{-3}$.

2. Growth of Second III-Nitride Crystal

Referring to FIG. 1, an explanation will be made.

To begin with, the freestanding GaN crystal A (first III-nitride crystal 10) was emplaced on the crystal holder 119 inside the reaction chamber 110. Subsequently, the ambient temperature in the source-gas introduction section (tantamount to the GaCl gas (Group-III metallic element source gas) preparation temperature) was brought to 850° C., the ambient temperature in the crystal-growth section (tantamount to the crystal growth temperature) was brought to 1120° C., the flow volume of the HCl gas 21 was brought to 100 ml/min, the flow volume of the NH$_3$ gas (tantamount to the nitrogen source gas 25) was brought to 250 ml/min, gaseous N$_2$ was employed as the carrier gas, and by holding for 7 hours conditions under which the collective gas flow volume was 4000 ml/min, GaN crystal A (second III-nitride crystal 20) of 1400 μm thickness was grown onto the major surface 10$m$ of the freestanding GaN crystal A (first III-nitride crystal 10). The crystal growth rate was 200 μm/h.

The GaN crystal A (second III-nitride crystal 20) grew across the entirety of the major surface 10$m$ of the freestanding GaN crystal A (first III-nitride crystal 10). What is more, upon observation of the crystal-growth surface of the grown GaN crystal A (second III-nitride crystal 20) under an optical microscope at a magnification of 10×, the entirety of the surface was specular, with no abnormal crystal-growth regions being present.

Embodiment 2

1. Preparation of First III-Nitride Crystal

Platelike freestanding GaN crystal B (first III-nitride crystal 10) of 600 μm thickness was obtained in the same manner as in Embodiment 1. Although the cause whereby, despite the growth conditions and other process parameters not being deliberately altered, a difference in concentration of alkali metal atoms within the crystal arose is not altogether clear, it is believed perhaps to derive from variation in the concentration of alkali metal atoms contained as impurities within the metallic Ga. The concentration of alkali metal atoms in the obtained freestanding GaN crystal B (first III-nitride crystal 10) was $5.0 \times 10^{16}$ cm$^{-3}$.

2. Growth of Second III-Nitride Crystal

In the same manner as in Embodiment 1, GaN crystal B (second III-nitride crystal 20) of 1400 μm thickness was grown onto the major surface 10m of the foregoing freestanding GaN crystal B (first III-nitride crystal 10). The crystal growth rate was 200 μm/h. The GaN crystal B (second III-nitride crystal 20) grew across the entirety of the major surface 10m of the freestanding GaN crystal B (first III-nitride crystal 10). Further, along the crystal-growth surface of the grown GaN crystal B (second III-nitride crystal 20) partially there were rough areas. Specifically, abnormal crystal-growth regions were identified in 5 places.

Embodiment 3

1. Preparation of First III-Nitride Crystal

Platelike freestanding GaN crystal C (first III-nitride crystal 10) of 600 μm thickness was obtained in the same manner as in Embodiment 1. Although the cause whereby, despite the growth conditions and other process parameters not being deliberately altered, a difference in concentration of alkali metal atoms within the crystal arose is not altogether clear, it is believed perhaps to derive from variation in the concentration of alkali metal atoms contained as impurities within the metallic Ga. The concentration of the atoms in the obtained freestanding GaN crystal C (first III-nitride crystal 10) was $7.0 \times 10^{17}$ cm$^{-3}$.

2. Growth of Second III-Nitride Crystal

In the same manner as in Embodiment 1, GaN crystal C (second III-nitride crystal 20) of 1400 μm thickness was grown onto the major surface 10m of the foregoing freestanding GaN crystal C (first III-nitride crystal 10). The crystal growth rate was 200 μm/h. The GaN crystal C (second III-nitride crystal 20) grew across the entirety of the major surface 10m of the freestanding GaN crystal C (first III-nitride crystal 10). Further, along the crystal-growth surface of the grown GaN crystal C (second III-nitride crystal 20) partially there were rough areas. Specifically, abnormal crystal-growth regions were identified in 28 places.

Comparative Example 1

1. Preparation of First III-Nitride Crystal

Platelike freestanding GaN crystal D (first III-nitride crystal 10) of 600 μm thickness was obtained in the same manner as in Embodiment 1. Although the cause whereby, despite the growth conditions and other process parameters not being deliberately altered, a difference in concentration of alkali metal atoms within the crystal arose is not altogether clear, it is believed perhaps to derive from variation in the concentration of alkali metal atoms contained as impurities within the metallic Ga. The concentration of alkali metal atoms in the obtained freestanding GaN crystal D (first III-nitride crystal 10) was $1.1 \times 10^{18}$ cm$^{-3}$.

2. Growth of Second III-Nitride Crystal

In the same manner as in Embodiment 1, GaN crystal D (second III-nitride crystal 20) of 1400 μm thickness was grown onto the major surface 10m of the foregoing freestanding GaN crystal D (first III-nitride crystal 10). The crystal growth rate was 200 μm/h. Crystal non-growth regions where it could be confirmed with the naked eye that the GaN crystal D (second III-nitride crystal 20) did not grow on the major surface 10m of the freestanding GaN crystal D (first III-nitride crystal 10) were identified in 3 places. These crystal non-growth regions measured some 1 mm to 10 mm across. Further, along the crystal-growth surface of the grown GaN crystal D (second III-nitride crystal 20) partially there were rough areas. Specifically, abnormal crystal-growth regions were identified in 60 places.

Reference Example 1

1. Preparation of First III-Nitride Crystal

Platelike freestanding GaN crystal E (first III-nitride crystal 10) of 600 μm thickness was obtained in the same manner as in Comparative Example 1. The concentration of alkali metal atoms in the obtained freestanding GaN crystal E (first III-nitride crystal 10) was $1.1 \times 10^{18}$ cm$^{-3}$.

2. Growth of Second III-Nitride Crystal

Apart from conditioning the ambient temperature in the crystal-growth section (tantamount to the crystal growth temperature) to be 1080° C., in the same manner as in Embodiment 1, GaN crystal E (second III-nitride crystal 20) of 1400 μm thickness was grown onto the major surface 10m of the foregoing freestanding GaN crystal E (first III-nitride crystal 10). The crystal growth rate was 200 μm/h. The GaN crystal E (second III-nitride crystal 20) grew across the entirety of the major surface 10m of the freestanding GaN crystal E (first III-nitride crystal 10). Furthermore, the crystal-growth surface of the grown GaN crystal E (second III-nitride crystal 20) was specular across the entire face, with no abnormal crystal-growth regions being present.

Embodiment 4

1. Preparation of First III-Nitride Crystal

Platelike freestanding GaN crystal F (first III-nitride crystal 10) of 600 μm thickness was obtained in the same manner as in Embodiment 1. The concentration of alkali metal atoms in the obtained freestanding GaN crystal F (first III-nitride crystal 10) was $8.0 \times 10^{15}$ cm$^{-3}$.

2. Growth of Second III-Nitride Crystal

Apart from employing gaseous $H_2$ as the carrier gas, and from conditioning the holding time (tantamount to the crystal-growth time) to be 14 hours, in the same manner as in Embodiment 1, GaN crystal F (second III-nitride crystal 20) of 1400 μm thickness was grown onto the major surface 10m of the foregoing freestanding GaN crystal F (first III-nitride crystal 10). The crystal growth rate was 100 μm/h. The GaN crystal F (second III-nitride crystal 20) grew across the entirety of the major surface 10m of the freestanding GaN crystal F (first III-nitride crystal 10). Furthermore, the crystal-growth surface of the grown GaN crystal F (second III-nitride crystal 20) was specular across the entire face, with no abnormal crystal-growth regions being present.

Through Reference Example 1 and Comparative Example 1, it was confirmed that in instances in which the concentration of alkali metal atoms in the first III-nitride crystal is $1.0\times10^{18}$ cm$^{-3}$ or more, if the ambient temperature during crystal growth (the crystal-growth temperature) is not greater than 1100° C., second III-nitride crystal grows across the entirety of the major surface of the first III-nitride crystal, while when it is higher than 1100° C., regions where second III-nitride crystal does not grow on the major surface of the first III-nitride crystal appear.

Meanwhile, through Comparative Example 1 and Embodiments 1 to 3, the following facts (1), (2) and (3) were ascertained regarding the influence of the concentration of alkali metal atoms in instances in which second III-nitride crystal is grown on the major surface of first III-nitride crystal in an ambient temperature higher than 1100° C.

(1) If the alkali-metal atom concentration in the first III-nitride crystal is at least $1.0\times10^{18}$ cm$^{-3}$, regions where second III-nitride crystal does not grow on the major surface of the first III-nitride crystal appear.

(2) If the alkali-metal atom concentration in the first III-nitride crystal is at least $1.0\times10^{16}$ cm$^{-3}$ but less than $1.0\times10^{18}$ cm$^{-3}$, across the entirety of the major surface of the first III-nitride crystal, second III-nitride crystal having any number of abnormal crystal-growth regions grows.

(3) If the alkali-metal atom concentration in the first III-nitride crystal is less than $1.0\times10^{16}$ cm$^{-3}$, across the entirety of the major surface of the first III-nitride crystal, second III-nitride crystal free of abnormal crystal-growth regions grows.

Furthermore, through Embodiment 1 and Embodiment 4, is was confirmed that in instances in which second III-nitride crystal was grown in an ambient temperature higher than 1100° C. onto the major surface of first III-nitride crystal having an alkali-metal atom concentration of less than $1.0\times10^{16}$ cm$^{-3}$, as the carrier gas even if gaseous nitrogen is employed and even if gaseous hydrogen is employed, second III-nitride crystal free of abnormal crystal-growth regions grows across the entirety of the major surface of the first III-nitride crystal.

The presently disclosed embodying modes and embodying examples should in all respects be considered to be illustrative and not limiting. The scope of the present invention is set forth not by the foregoing description but by the scope of the patent claims, and is intended to include meanings equivalent to the scope of the patent claims and all modifications within the scope.

What is claimed is:

1. A III-nitride crystal growth flux-free method comprising:

in a solution-growth deposition apparatus having a growth chamber and including a growth vessel placeable inside the growth chamber, a step of placing a Group-III nitride seed crystal into the growth vessel, a step of placing a Group-III metallic element of not less than 99 mass % purity into the growth vessel and setting the vessel inside the growth chamber, a step of introducing nitrogen gas of not less than 99 mass % purity into the growth chamber, pressurizing the chamber, and bringing the ambient temperature inside the chamber to a temperature of between 1000° C. and 1300° C., such as to liquefy the Group-III metallic element and yield a Group-III metallic element melt of not less than 99 mass % purity, a step of further introducing at least 99 mass % purity nitrogen gas into the growth chamber and bringing the ambient pressure inside the chamber to a pressure of between 100 MPa and 300 MPa, to carry out a dissolution of the nitrogen into the Group-III metallic element melt so as to yield a solution in which at least 99 mass % purity nitrogen has been dissolved into the melt of at least 99 mass % purity Group-III metallic element, and such as to grow a first III-nitride crystal having an alkali-metal atom concentration of not greater than $1.0\times10^{16}$ cm$^{-3}$ is onto the III-nitride seed crystal; and in a hydride vapor-phase epitaxy reaction chamber having a crystal-growth section, a step of emplacing the first III-nitride crystal, with a major surface thereof exposed, into the crystal-growth section of the HVPE reaction chamber, a step of bringing the ambient temperature of the crystal-growth section to higher than 1100° C., and a step of introducing a Group-III metallic element source gas and a nitrogen source gas into the crystal-growth section, to HVPE grow a second III-nitride crystal onto the major surface of the first III-nitride crystal; whereby the second III-nitride crystal is grown across the entirety of the first III-nitride crystal, without abnormal crystal-growth regions arising on the first III-nitride crystal major surface.

2. The III-nitride crystal growth method set forth in claim 1, wherein the alkali-metal atom concentration in the first III-nitride crystal is less than $1.0\times10^{16}$ cm$^{-3}$.

3. The III-nitride crystal growth method set forth in claim 1, wherein the first III-nitride crystal is of the same chemical composition as the second III-nitride crystal.

4. The III-nitride crystal growth method set forth in claim 1, wherein in said HVPE growth step the crystal-growth rate is 200 μm/h.

5. The III-nitride crystal growth method set forth in claim 1, wherein the starting substrate has a diameter of 2 inches.

* * * * *